United States Patent [19]

Ahn et al.

[11] Patent Number: 4,626,962
[45] Date of Patent: Dec. 2, 1986

[54] CIRCUIT BOARD ASSEMBLY WITH BUILT IN WIRE GRIPPER

[75] Inventors: Youngkee Ahn, Buffalo Grove; Morris Tarshis, Lincolnwood, both of Ill.

[73] Assignee: Motorola, Inc., Schaumburg, Ill.

[21] Appl. No.: 739,394

[22] Filed: May 30, 1985

[51] Int. Cl.$^4$ .............................. H05K 5/03
[52] U.S. Cl. .................. 361/399; 339/17 C; 339/17 N; 339/103 M; 339/107; 361/394; 361/395; 361/408; 361/419
[58] Field of Search ................. 361/394–396, 361/398–400, 403, 408, 415, 418–419; 339/17 C, 17 N, 103 R, 103 B, 103 C, 103 M, 101, 107, 193 P; 174/65 R, 163 R, 52 PE

[56] References Cited

U.S. PATENT DOCUMENTS

| 3,437,980 | 4/1969 | Smith | 339/103 |
|---|---|---|---|
| 3,566,192 | 2/1971 | Stump, Jr. | 174/52 PE |
| 3,861,778 | 1/1975 | Capra | 339/103 R |
| 4,053,943 | 10/1977 | Galvin | 361/399 |
| 4,329,732 | 5/1982 | Kavli et al. | 361/399 X |
| 4,350,839 | 9/1982 | Lass | 174/65 |
| 4,389,535 | 6/1983 | Slater et al. | 174/65 R |
| 4,460,227 | 7/1984 | Ball | 339/94 |
| 4,528,616 | 7/1985 | Koppensteiner | 361/399 |

FOREIGN PATENT DOCUMENTS

| 0141423 | 5/1985 | European Pat. Off. | 339/103 R |
|---|---|---|---|
| 2345149 | 6/1974 | Fed. Rep. of Germany | 339/193 P |

Primary Examiner—Arthur T. Grimley
Assistant Examiner—Jane K. Lau
Attorney, Agent, or Firm—John H. Moore

[57] ABSTRACT

A housing for a circuit board includes a top cover in which a plurality of apertures are formed for receiving wires which are to be bonded to a circuit board located beneath the top cover. Associated with each aperture is a specially formed wire gripper which provides strain relief for the wire which passes through the associated aperture.

4 Claims, 4 Drawing Figures

CIRCUIT BOARD ASSEMBLY WITH BUILT IN WIRE GRIPPER

FIELD OF THE INVENTION

This invention is directed to the field of electronic circuit boards and to techniques for bonding external wires to terminals located on the circuit boards.

BACKGROUND OF THE INVENTION

Circuit boards with which this invention finds use may take the form of thick film substrates, printed circuit boards, or the like. Irrespective of the type of circuit board, it will normally carry a number of electrical components mounted on its surface, with plated electrical conductors connecting the components in prearranged patterns. Typically, such a circuit board also includes terminals or pads to which external wires must be bonded to make electrical connection with the components mounted on the board.

In the manufacture of products using such circuit boards, it is desireable that the external wires be easily and rapidly bonded to the circuit board terminals in a manner which holds down the cost of the manufacturing process. It is also important that the bonded wires be mechanically held in position during and after the bonding process to protect them from being accidentally pulled away from their terminals and to eliminate mechanical stress from being coupled from the wire to the terminal, and thence to the circuit board itself. Stated differently, the bonded wires should be provided with strain relief.

In some applications, the circuit board may be carried inside a housing, thus requiring that the external wires pass through apertures in the housing to make connection to the terminals on the circuit board. Even in this application, the requirements of easy and rapid wire bonding should still be satisfied, and the circuit board should still be protected from mechanical stress applied to the wires, as discussed above.

Conventional techniques for effecting the type of circuit board assembly described above have proved to be inadequate either in terms of cost, required assembly time, or lack of sufficient strain relief.

OBJECTS OF THE INVENTION

It is a general object of the invention to provide an improved circuit board assembly which satisfies the requirements discussed above.

It is a more particular object of the invention to provide an improved circuit board assembly wherein the external connecting wires are easily bonded to terminals on the circuit board and adequate strain relief for the wires is provided.

BRIEF DESCRIPTION OF THE FIGURES

FIG. 3 shows a wire gripper which is preferably formed in the top cover of the illustrated circuit board assembly.

SUMMARY OF THE INVENTION

Broadly stated, the invention provides a circuit board assembly wherein a housing, have a top cover and a base, encloses a circuit board which carries a plurality of terminals which are to be bonded to external wires. A plurality of aperatures are formed in the top cover, each aperture being designed to receive a wire and each being in substantial vertical alignment with one of the terminals on the circuit board. Also formed in the top cover are a plurality of wire grippers, each being associated with one of the apertures. Each wire gripper includes three fingers which extend downwardly from the top cover and which are spaced apart from each other substantially equally around the perimeter of an associated aperture. The fingers are formed so that, when a wire is inserted through an aperture, the wire passes thorugh the fingers and flexes the fingers outwardly. The pressure exerted on the wire by the flexed fingers holds the wire against removal and holds it in substantial registration with an underlying terminal to which the wire is to be bonded.

BRIEF DESCRIPTION OF THE PREFERRED EMBODIMENT

Figure 1:
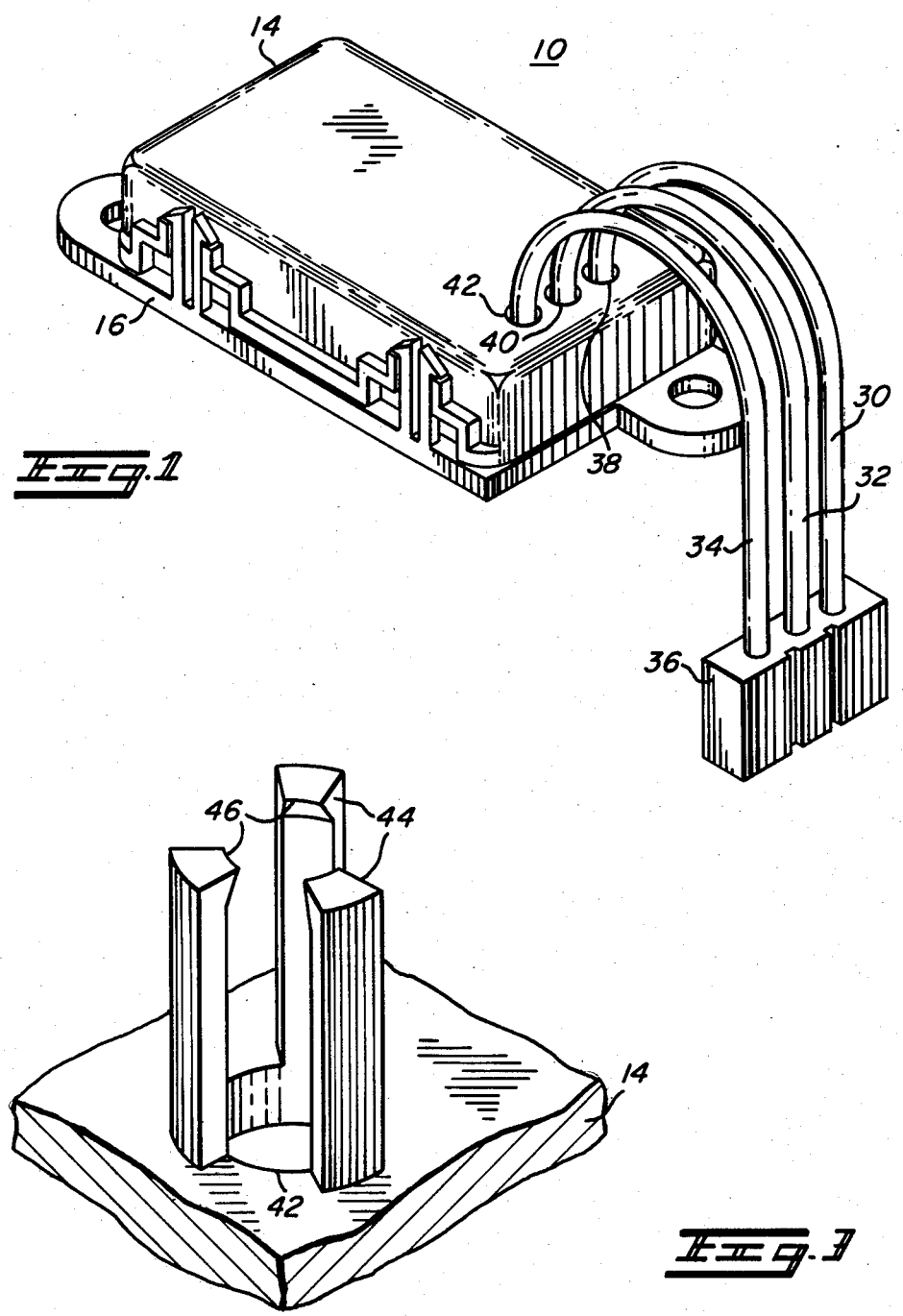
FIG. 1 is a perspective view of a circuit board assembly constructed in accordance with the invention.
Figure 2:
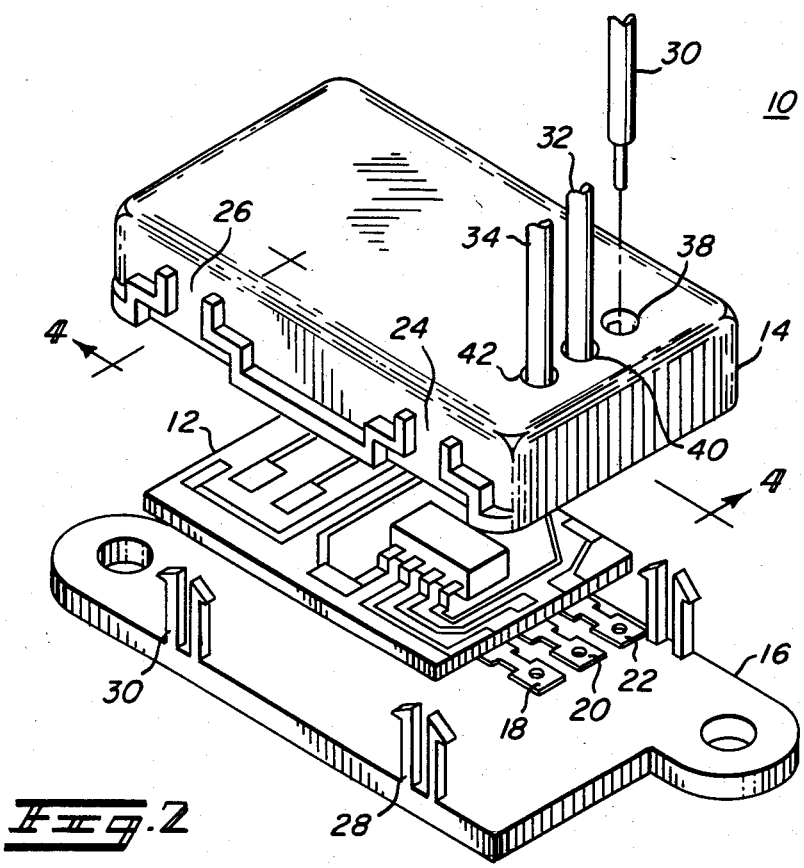
FIG. 2 is an exploded view of the circuit board assembly shown in FIG. 1.

Referring to FIGS. 1 and 2, there is shown a preferred form of a circuit board assembly 10 whose general function is to house an internal circuit board 12 and to couple terminals on the circuit board to a plurality of external wires.

The illustrated embodiment of the assembly 10 includes a housing comprising a top cover 14 and a bottom or base portion 16. Both the top cover and the base may be molded using a glass reinformed thermoplastic polyester material.

Situated below the top cover is the circuit board 12 which may be, for example, a thick film substrate which carries a plurality of surface-mounted components thereon. Conductive paths plated on the upper surface of the board 12 terminate at terminals 18, 20, and 22. These terminals will be bonded (as by soldering) to external wires as will be described later.

To secure the top cover 14 to the base 16, the top cover may include molded receptacles 24, 26 for receiving upwardly extending pairs of legs 28, 30 which are integrally molded with the base 16. When the cover 14 is properly mated with the base 16, the legs 28, 30 latch in the receptacles 24, 26 so as to hold the cover and the base together with the circuit board 12 enclosed within.

As shown, three wires 30, 32 and 34 are included to couple a connector 36 to the terminals 18, 20 and 22. For this purpose the top cover 14 includes three apertures 38, 40, 42, each aperture being adapted to receive one of the illustrated wires. These three apertures are preferably located such that each is in substantial vertical alignment with an associated one of the terminals 18, 20 and 22. Thus, the aperture 42 is vertically aligned with the terminal 18, the aperture 40 is vertically aligned with the terminal 20, and the aperture 38 is vertically aligned with the terminal 22.

Each of the apertures 38, 40, 42 is associated with a wire gripper which is formed in the top cover 14. Each such gripper includes three fingers which are spaced around the peripherey of an aperture and which extend downwardly from the front cover. See FIG. 3 in which the fingers are shown in an upside-down view to illustrate their structure more clearly.

As shown, the gripper associated with the aperture 42 has three fingers 44 which are spaced substantially equally around the perimeter of the aperture 42 and which extend away from the top cover 14. Each of the fingers 44 preferably includes an inwardly directed, pointed, wire-gripping edge 46 at its lower end.

In the preferred construction of the assembly, the fingers 44 are molded as an intregal part of the top cover 14. In one application for holding no. 20 wire, each finger was constructed to have a height of 0.172 inch and a wall thickness of 0.040 inch, and was made from the previously mentioned plastic material. Other dimensions and material may, of course, be used, but the fingers should be constructed to permit them to flex outwardly as a wire is inserted between them so that their edges 46 will bear forcefully on the wire to hold it securely.

To connect the insulated wire 34 to the terminal 18, for example, enough insulation is removed from the connecting end of the wire to permit the wire to be later soldered (or otherwise bonded) to the terminal 18. The wire 34 is then inserted into the aperture 42 and pushed downwardly so that it passes between the fingers 44. As the insulation on the wire meets the finger edges 46, the fingers 44 flex outwardly to permit the wire to be forced downwardly. Typically, the wire will continue to be forced downwardly until the bare end of the wire is positioned at a point where it is convenient for an operator (or machine) to bond the base end of the wire to the terminal 18.

With the wire 34 thus positioned, the finger edges 46 bear on and are urged inwardly against the wire's insulation. Consequently, the wire 34 is held tightly in registration with the terminal 18 while it is being bonded to that terminal. This makes it easier for an operator to complete the bonding process. Further, the finger edges 46 grip the wire's insulation tightly enough to prevent the wire 34 from being accidently pulled away from the terminal 18. This, of course, is the strain relief which prevents upward force on the wire from being transmitted to the circuit board or to one of the board's terminals.

Figure 4:
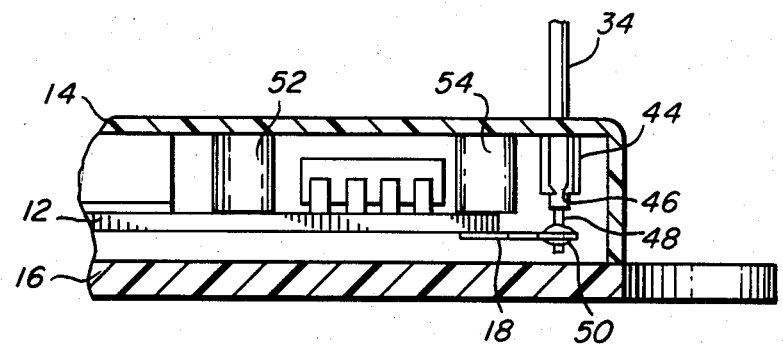
FIG. 4 is a view of the circuit board assembly taken along section lines 4—4 of FIG. 2.

Referring briefly to FIG. 4, the wire 34 is shown as it is held in place by the fingers 44 and their gripping edges 46. The bare end 48 of the wire 34 is soldered at 50 to the terminal 18. This view also shows spacers 52 and 54 which are molded integrally with the top cover 14. These spacers depend downwardly from the top cover to hold the upper surface of the circuit board 12 a preselected distance below the top cover 14. This, in conjunction with the bond formed between the terminal 18 and the wire 34, substantially fixes the location of the circuit board 12 within the housing formed by the top cover 14 and the base 16.

From the foregoing description, it should be clear that this circuit board assembly provides for easy connection between a circuit board and external wires, while simultaneously providing strain relief from the wires. It will be obvious to those skilled in the art that similar results may be achieved by making various alterations to the illustrated assembly, but without departing from the invention. Accordingly, it is intended that all such alterations be considered as within the spirit and scope of the invention as defined by the appended claims.

We claim:

1. A circuit board assembly with built-in strain relief, comprising:
    a housing for a circuit board, the housing including a top cover below which the circuit board may be positioned;
    a circuit board carrying a plurality of terminals for connecting various points on the circuit board to a corresponding plurality of external wires, said terminals being positioned below the top cover;
    a plurality of apertures formed in the top cover, each of said apertures being in substantial vertical alignment with a corresponding one of the terminals and being adapted to receive a wire which is to be bonded to the corresponding terminal;
    a plurality of wire grippers formed in the top cover of the housing, each of said grippers being associated with one of said apertures and each comprising:
    three fingers integrally formed with the top cover, the fingers extending downwardly from the front cover and spaced apart from each other substantially equally around the perimeter of the associated aperture, the fingers being formed so as to flex outwardly to permit a wire to be inserted through the associated aperture and between the fingers, but holding the inserted wire against removal in the opposite direction and holding the wire in substantial registration with an underlying terminal.

2. A circuit board assembly as set forth in claim 1 wherein each finger terminates in a wire-gripping edge.

3. A circuit board assembly as set forth in claim 1 wherein the top cover includes a plurality of spacers which extend downwardly from the top cover for spacing the circuit board a selected distance from the top cover.

4. A circuit board assembly, comprising:
    a housing for a circuit board, the housing having a top cover and a base;
    a circuit board located in the housing between the top cover and the base;
    a plurality of spacers extending downwardly from the top cover for spacing the circuit board a selected distance from the top cover;
    a plurality of terminals extending from an edge of the circuit board and located within the housing;
    a plurality of apertures formed in the top cover, each of said apertures being in substantial vertical alignment with a corresponding one of the terminals and being adapted to receive a wire which is to be bonded to the corresponding terminal;
    a plurality of wire grippers formed in the top cover of the housing, each of said grippers being associated with one of the apertures and each comprising;
    three fingers integrally formed with the top cover, extending downwardly therefrom, and spaced apart from each other around the perimeter of the associated aperture, the fingers each terminating in an inwardly protruding, wire-gripping edge and being formed so as to flex outwardly when a wire is inserted into the associated aperture and pushed through the fingers, thereby to hold the inserted wire against removal in the opposite direction and to hold the wire in substantial registration with an underlying terminal.

* * * * *